(12) United States Patent  
Hou et al.

(10) Patent No.: US 9,013,340 B1
(45) Date of Patent: Apr. 21, 2015

(54) PROTECTION CIRCUIT FOR ANALOG-TO-DIGITAL CONVERTER, DIGITAL POWER SUPPLY, DIGITAL SIGNAL PROCESSING METHOD, PROCESSING MODULE, AND CIRCUIT PROTECTION METHOD

(71) Applicant: Huawei Technologies Co., Ltd., Shenzhen (CN)

(72) Inventors: Zhaozheng Hou, Shenzhen (CN); Ying Li, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/570,505

(22) Filed: Dec. 15, 2014

(30) Foreign Application Priority Data

Dec. 16, 2013 (CN) .......................... 2013 1 0689157

(51) Int. Cl.
*H03M 1/00* (2006.01)
*H03M 1/18* (2006.01)
*H03M 1/06* (2006.01)
*H03M 1/12* (2006.01)

(52) U.S. Cl.
CPC ............ *H03M 1/183* (2013.01); *H03M 1/0626* (2013.01); *H03M 1/124* (2013.01)

(58) Field of Classification Search
CPC ....... H03M 1/18; H03M 1/183; H03M 1/124; H03M 1/0626
USPC .......................................... 341/118, 139, 155
See application file for complete search history.

(56) References Cited

U.S. PATENT DOCUMENTS 6,292,120 B1 * 9/2001 Painchaud et al. ............ 341/139
6,930,553 B2 * 8/2005 Takahashi ..................... 330/279

* cited by examiner

*Primary Examiner* — Khai M Nguyen
(74) *Attorney, Agent, or Firm* — Leydig, Voit & Mayer, Ltd.

(57) ABSTRACT

A protection circuit includes: a first gain module, configured to receive a first input signal, scale the first input signal according to a first scaling factor, to obtain a first analog signal, receive a third scaling factor from a processing module, and scale the second input signal according to the third scaling factor, to obtain a second analog signal; an analog-to-digital converter, configured to convert the first analog signal into a first digital signal, and convert the second analog signal into a second digital signal; the processing module, configured to determine, according to a voltage value of the first digital signal and a preset scaling factor determining rule, the third scaling factor and a fourth scaling factor; and a second gain module, configured to scale the first digital signal according to a second scaling factor, and scale the second digital signal according to the fourth scaling factor.

18 Claims, 6 Drawing Sheets

PROTECTION CIRCUIT FOR ANALOG-TO-DIGITAL CONVERTER, DIGITAL POWER SUPPLY, DIGITAL SIGNAL PROCESSING METHOD, PROCESSING MODULE, AND CIRCUIT PROTECTION METHOD

CROSS-REFERENCE TO RELATED APPLICATIONS

This application claims priority to Chinese Patent Application No. 201310689157.5, filed on Dec. 16, 2013, which is hereby incorporated by reference in its entirety.

TECHNICAL FIELD

The present invention relates to the field of power electronics technologies, and in particular, to a protection circuit for an analog-to-digital converter, a digital power supply, a digital signal processing method, a processing module, and a circuit protection method.

BACKGROUND

There are mainly two types of power supplies, namely analog power supplies and digital power supplies. With the development of power electronics technologies and an increase in application environment complexity, the digital power supplies attract more and more attention because of their excellent features such as strong adaptability, high flexibility, and good extensibility.

A conventional digital power supply generally includes: an analog-to-digital converter (Analog-to-Digital Converter, "ADC" for short), an error amplifier, a digital filter, a digital pulse width modulator (Digital Pulse Width Modulator, "DPWM" for short), a power stage circuit, and a feedback network. The feedback network collects an output signal of the power stage circuit; the error amplifier compares the output signal collected by the feedback network with a reference signal, to obtain an error signal; the ADC converts the error signal from an analog signal into a digital signal, and outputs the digital signal to the digital filter; the digital filter obtains a digital control signal according to the digital signal and sends the digital control signal to the DPWM; and the DPWM generates a pulse width modulation (Pulse Width Modulation, "PWM" for short) signal according to the digital control signal to control an on-off action of a power switch in the power stage circuit, so as to achieve an objective of controlling the output signal of the power stage circuit.

The prior art at least has the following problems:

During running of the digital power supply, especially in the case of start-up or an input surge current shock, the error signal may exceed an input range of the ADC, causing ADC saturation. In this case, if the error signal is greater than a maximum value of the input range of the ADC, the ADC outputs a digital signal corresponding to the maximum value of the input range, causing inaccurate output of the ADC, and further causing instability of an output signal of the digital power supply.

SUMMARY

To solve a problem in the prior art that output of an analog-to-digital converter is unstable due to ADC saturation, embodiments of the present invention provide a protection circuit for an analog-to-digital converter, a digital power supply, a digital signal processing method, a processing module, and a circuit protection method. The technical solutions are as follows:

An embodiment of a first aspect of the present invention provides a protection circuit for an analog-to-digital converter, where the protection circuit includes:

a first gain module, configured to receive a first input signal, and scale the first input signal according to a first scaling factor, to obtain a first analog signal, where the first gain module is further configured to receive a second input signal, receive a third scaling factor from a processing module, and scale the second input signal according to the third scaling factor, to obtain a second analog signal;

an analog-to-digital converter, configured to convert the first analog signal obtained by the first gain module into a first digital signal, and configured to convert the second analog signal obtained by the first gain module into a second digital signal;

the processing module, configured to determine, according to a voltage value of the first digital signal converted by the analog-to-digital converter and a preset scaling factor determining rule, the third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the analog-to-digital converter; and the processing module is further configured to:

determine, according to a principle that a product of the third scaling factor and a fourth scaling factor is 1, the fourth scaling factor corresponding to the third scaling factor; and a second gain module, configured to scale the first digital signal according to a second scaling factor, to obtain the scaled first digital signal, and configured to scale the second digital signal according to the fourth scaling factor obtained by the processing module, to obtain the scaled second digital signal, where a product of the first scaling factor and the second scaling factor is 1.

In an implementation manner of the embodiment of the first aspect of the present invention, the protection circuit further includes:

an acquisition module, configured to sample the first digital signal converted by the analog-to-digital converter, to obtain the voltage value of the first digital signal.

With reference to any one of the foregoing embodiments, in a second implementation manner of the embodiment of the first aspect of the present invention, the processing module includes:

a scaling factor determining unit, configured to receive the voltage value of the first digital signal, and when the voltage value of the first digital signal<−61, determine that the third scaling factor is a positive number less than 1;

when the voltage value of the first digital signal>127, determine that the third scaling factor is a positive number less than 1; and when −61≤the voltage value of the first digital signal≤127, determine that the third scaling factor is 1; and a first calculation unit, configured to:

determine, according to the principle that the product of the third scaling factor and the fourth scaling factor is 1, the fourth scaling factor corresponding to the third scaling factor.

With reference to the embodiment of the first aspect of the present invention and/or the embodiment of the first implementation manner of the first aspect of the present invention, in a third implementation manner of the first aspect of the present invention, the processing module includes: a first threshold unit, configured to acquire a scaling factor change value corresponding to the voltage value of the first digital signal, and multiply the scaling factor change value by the first scaling factor, to obtain the third scaling factor corresponding to the voltage value of the digital signal, where when the voltage value of the digital signal is greater than or equal to a preset first upper threshold, or when the voltage value of the digital signal is less than or equal to a preset first lower threshold, the scaling factor change value is K1, where K1 is a positive number and 0<K1<1; when the voltage value of the digital signal is less than or equal to a preset second upper threshold and the voltage value of the digital signal is greater than or equal to a preset second lower threshold, the scaling factor change value is K2, where K2 is a positive number and 1<K2; when the voltage value of the digital signal is greater than the first lower threshold and the voltage value of the digital signal is less than the second lower threshold, the scaling factor change value is equal to 1; and when the voltage value of the digital signal is less than the first upper threshold and the voltage value of the digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127; and a second calculation unit, configured to:

determine, according to the principle that the product of the third scaling factor and the fourth scaling factor is 1, the fourth scaling factor corresponding to the third scaling factor.

With reference to any one of the foregoing embodiments, in a fourth implementation manner of the embodiment of the first aspect of the present invention, the first gain module includes an operational amplifier.

With reference to any one of the foregoing embodiments, in a fifth implementation manner of the embodiment of the first aspect of the present invention, the second gain module includes a shift register.

An embodiment of a second aspect of the present invention provides a digital power supply, where the digital power supply includes:

a power stage circuit;

a feedback network, configured to sample an output signal of the power stage circuit;

an error amplifier, configured to compare a first output signal of the power stage circuit with a reference signal, to obtain a first input signal, where the first output signal is obtained by the feedback network through sampling, and configured to compare a second output signal of the power stage circuit with the reference signal, to obtain a second input signal, where the second output signal is obtained by the feedback network through sampling;

the protection circuit for the analog-to-digital converter according to any one of the embodiments of the first aspect;

a digital filter, configured to generate a second digital control signal according to the scaled second digital signal obtained by the protection circuit for the analog-to-digital converter; and a digital pulse width modulator, configured to convert a duty cycle parameter in the second digital control signal output by the digital filter into a pulse width variation, to obtain a pulse width modulation signal, and control an on-off action of a power switch in the power stage circuit by using the pulse width modulation signal.

An embodiment of a third aspect of the present invention provides a circuit protection method, where the protection method includes:

receiving a first input signal, and scaling the first input signal according to a first scaling factor, to obtain a first analog signal;

converting the first analog signal into a first digital signal;

determining, according to a voltage value of the first digital signal and a preset scaling factor determining rule, a third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1;

scaling the first digital signal according to a second scaling factor, to obtain the scaled first digital signal, where a product of the first scaling factor and the second scaling factor is 1;

receiving a second input signal, and scaling the second input signal according to the third scaling factor, to obtain a second analog signal;

converting the second analog signal into a second digital signal;

determining, according to a principle that a product of the third scaling factor and a fourth scaling factor is 1, the fourth scaling factor corresponding to the third scaling factor; and scaling the second digital signal according to the fourth scaling factor, to obtain the scaled second digital signal.

In a first implementation manner of the embodiment of the third aspect of the present invention, the preset range is [−61, 127].

In a second implementation manner of the embodiment of the third aspect of the present invention, the determining, according to a voltage value of the first digital signal and a preset scaling factor determining rule, a third scaling factor corresponding to the voltage value of the first digital signal includes:

multiplying a scaling factor change value by the first scaling factor, to obtain the third scaling factor corresponding to the voltage value of the first digital signal, where when the voltage value of the first digital signal is greater than or equal to a preset first upper threshold, or when the voltage value of the first digital signal is less than or equal to a preset first lower threshold, the scaling factor change value is K1, where K1 is a positive number and 0<K1<1; when the voltage value of the first digital signal is less than or equal to a preset second upper threshold and the voltage value of the first digital signal is greater than or equal to a preset second lower threshold, the scaling factor change value is K2, where K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127.

The technical solutions provided in the embodiments of the present invention have the following beneficial effects:

A third scaling factor corresponding to a voltage value of a first digital signal is determined according to the voltage value of the first digital signal converted by an ADC and a preset scaling factor determining rule, a second input signal is scaled according to the third scaling factor, to obtain a second analog signal, and the second analog signal is input into the ADC. Because the third scaling factor is determined according to the first digital signal output by the ADC, after the second input signal is scaled according to the third scaling factor obtained in this manner, and after one or more times of scaling processing, an input signal can be adjusted to be in an input range of the ADC. Therefore, ADC saturation is avoided in the case of start-up, or an input surge current shock, so that even in the case of start-up, or an input surge current shock, the ADC can still work normally, thereby ensuring normal output of a digital power supply, and improving an anti-interference capability and stability of the digital power supply.

An embodiment of a fourth aspect of the present invention provides a processing module in a protection circuit for an analog-to-digital converter, where the processing module includes:

a scaling factor determining unit, configured to receive a voltage value of a first digital signal, and configured to determine, according to the voltage value of the first digital signal and a preset scaling factor determining rule, a third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the analog-to-digital converter; and a first calculation unit, configured to:

determine, according to a principle that a product of the third scaling factor and a fourth scaling factor is 1, the fourth scaling factor corresponding to the third scaling factor.

In a first implementation manner of the embodiment of the fourth aspect of the present invention, the preset range is [−61, 127].

In a second possible implementation manner of the embodiment of the fourth aspect of the present invention, the scaling factor determining unit includes:

a receiving subunit, configured to receive the voltage value of the first digital signal; and a determining subunit, configured to: when the voltage value of the first digital signal<−61, determine that the third scaling factor is a positive number less than 1;

when the voltage value of the first digital signal>127, determine that the third scaling factor is a positive number less than 1; and when −61≤the voltage value of the first digital signal≤127, determine that the third scaling factor is 1.

In a third implementation manner of the embodiment of the fourth aspect of the present invention, the scaling factor determining unit includes: a first threshold subunit, configured to acquire a scaling factor change value corresponding to the voltage value of the first digital signal, where when the voltage value of the first digital signal is greater than or equal to a preset first upper threshold, or when the voltage value of the first digital signal is less than or equal to a preset first lower threshold, the scaling factor change value is K1, where K1 is a positive number and 0<K1<1; when the voltage value of the first digital signal is less than or equal to a preset second upper threshold and the voltage value of the first digital signal is greater than or equal to a preset second lower threshold, the scaling factor change value is K2, where K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127; and a second threshold subunit, configured to multiply the scaling factor change value by the first scaling factor, to obtain the third scaling factor corresponding to the voltage value of the first digital signal.

An embodiment of a fifth aspect of the present invention provides a digital signal processing method, where the method includes:

receiving a voltage value of a first digital signal;

determining, according to the voltage value of the first digital signal and a preset scaling factor determining rule, a scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the analog-to-digital converter; and determining, according to a principle that a product of the third scaling factor and a fourth scaling factor is 1, the fourth scaling factor corresponding to the third scaling factor.

In a first implementation manner of the embodiment of the fifth aspect of the present invention, the determining, according to the voltage value of the first digital signal and a preset scaling factor determining rule, a third scaling factor corresponding to the voltage value of the first digital signal includes:

multiplying a scaling factor change value by the first scaling factor, to obtain the third scaling factor corresponding to the voltage value of the first digital signal, where when the voltage value of the first digital signal is greater than or equal to a preset first upper threshold, or when the voltage value of the first digital signal is less than or equal to a preset first lower threshold, the scaling factor change value is K1, where K1 is a positive number and 0<K1<1; when the voltage value of the first digital signal is less than or equal to a preset second upper threshold and the voltage value of the first digital signal is greater than or equal to a preset second lower threshold, the scaling factor change value is K2, where K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127.

In a second implementation manner of the embodiment of the fifth aspect of the present invention, the preset range is [−61, 127].

In a third implementation manner of the embodiment of the fifth aspect of the present invention, the determining, according to the voltage value of the first digital signal and a preset scaling factor determining rule, a scaling factor corresponding to the voltage value of the first digital signal includes:

when the voltage value of the first digital signal<−61, determining that the third scaling factor is a positive number less than 1;

when the voltage value of the first digital signal>127, determining that the third scaling factor is a positive number less than 1; and when −61≤the voltage value of the first digital signal≤127, determining that the third scaling factor is 1.

In the processing method according to the embodiments of the present invention, a third scaling factor corresponding to the voltage value of a first digital signal is determined according to the voltage value of the first digital signal and a preset scaling factor, a second input signal is scaled according to the third scaling factor, to obtain a second analog signal, and the second analog signal is input into an ADC. Because the third scaling factor is determined according to the first digital signal output by the ADC, after the second input signal is scaled according to the third scaling factor obtained in this manner, an input signal can be adjusted to be in an input range of the ADC. Therefore, ADC saturation is avoided in the case of start-up, or an input surge current shock, so that even in the case of start-up, or an input surge current shock, the ADC can still work normally.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the present invention clearer, the following further describes the embodiments of the present invention in detail with reference to the accompanying drawings.

Figure 1:
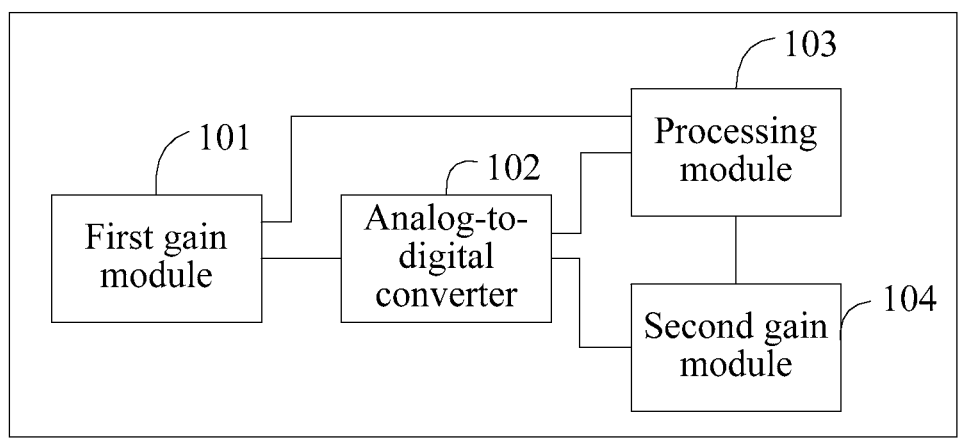
FIG. 1 is a schematic structural diagram of a protection circuit for an analog-to-digital converter according to an embodiment of the present invention.

FIG. 1 is a schematic structural diagram of a protection circuit for an analog-to-digital converter according to an embodiment of the present invention. Referring to FIG. 1, the digital power supply control circuit includes:

a first gain module 101, configured to receive a first input signal, and scale the first input signal according to a first scaling factor, to obtain a first analog signal, where the first gain module 101 is further configured to receive a second input signal, receive a third scaling factor from a processing module 103, and scale the second input signal according to the third scaling factor, to obtain a second analog signal;

an ADC 102, configured to convert the first analog signal obtained by the first gain module 101 into a first digital signal, and configured to convert the second analog signal obtained by the first gain module 101 into a second digital signal;

the processing module 103, configured to determine, according to a voltage value of the first digital signal converted by the ADC 102 and a preset scaling factor determining rule, a third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the ADC 102; and the processing module 103 is further configured to:

determine, according to a principle that a product of the third scaling factor and a fourth scaling factor is 1, the fourth scaling factor corresponding to the third scaling factor; and a second gain module 104, configured to scale the first digital signal according to a second scaling factor, to obtain the scaled first digital signal, and configured to scale the second digital signal according to the fourth scaling factor obtained by the processing module 103, to obtain the scaled second digital signal, where a product of the first scaling factor and the second scaling factor is 1.

In the embodiment of the present invention, a third scaling factor corresponding to a voltage value of a first digital signal is determined according to the voltage value of the first digital signal converted by an ADC and a preset scaling factor determining rule, a second input signal is scaled according to the third scaling factor, to obtain a second analog signal, and the second analog signal is input into the ADC. Because the third scaling factor is determined according to the first digital signal output by the ADC, after the second input signal is scaled according to the third scaling factor obtained in this manner, and after one or more times of scaling processing, an input signal can be adjusted to be in an input range of the ADC. Therefore, ADC saturation is avoided in the case of start-up, or an input surge current shock, so that even in the case of start-up, or an input surge current shock, the ADC can still work normally, thereby ensuring normal output of a digital power supply, and improving an anti-interference capability and stability of the digital power supply.

Figure 2:
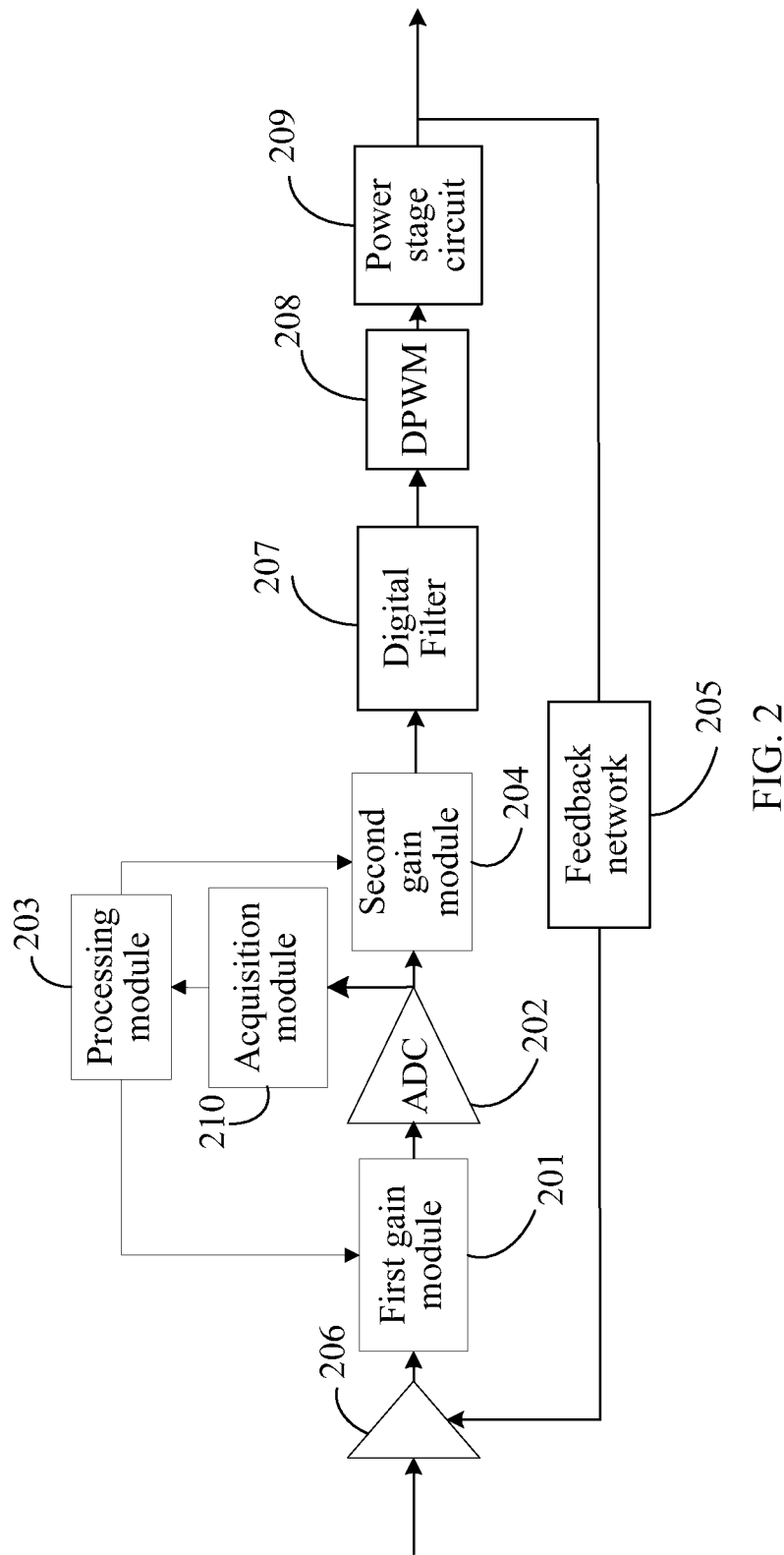
FIG. 2 is a schematic structural diagram of a protection circuit for an analog-to-digital converter according to an embodiment of the present invention.

FIG. 2 is a schematic structural diagram of a protection circuit for an analog-to-digital converter according to an embodiment of the present invention. Referring to FIG. 2, the digital power supply control circuit includes:

a first gain module 201, configured to receive a first input signal, and scale the first input signal according to a first scaling factor, to obtain a first analog signal, where the first gain module 201 is further configured to receive a second input signal, receive a third scaling factor from a processing module 203, and scale the second input signal according to the third scaling factor, to obtain a second analog signal;

an ADC 202, configured to convert the first analog signal obtained by the first gain module 201 into a first digital signal, and configured to convert the second analog signal obtained by the first gain module 201 into a second digital signal;

the processing module 203, configured to determine, according to a voltage value of the first digital signal converted by the ADC 202 and a preset scaling factor determining rule, a third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the ADC 202; and the processing module 203 is further configured to:

determine, according to a principle that a product of the third scaling factor and a fourth scaling factor is 1, the fourth scaling factor corresponding to the third scaling factor; and a second gain module 204, configured to scale the first digital signal according to a second scaling factor, to obtain the scaled first digital signal, and configured to scale the second digital signal according to the fourth scaling factor obtained by the processing module 203, to obtain the scaled second digital signal, where a product of the first scaling factor and the second scaling factor is 1.

The foregoing first input signal and second input signal are error signals generated by comparing output signals of a digital power supply with a reference signal, where the output signals are collected by a feedback network 205, and an error amplifier 206 uses the output signals and the reference signal as input, and outputs the error signals.

In a specific implementation of this embodiment, the digital power supply controls output of the digital power supply according to the digital signal output by the ADC 202. A specific process is as follows: A digital filter 207 uses a scaled first digital signal or a scaled second digital signal as input, and sends the output signal to a DPWM 208; and the DPWM 208 generates a pulse width modulation signal according to the output of the digital filter 207, and controls an on-off action of a power stage circuit 209 by using the pulse width modulation signal.

Further, the protection circuit further includes:

an acquisition module 210, configured to sample the first digital signal converted by the ADC 202, to obtain the voltage value of the first digital signal.

In an implementation manner of this embodiment, the processing module 203 may include:

a scaling factor determining unit, configured to receive the voltage value of the first digital signal, and when the voltage value of the first digital signal<−61, determine that the third scaling factor is a positive number less than 1;

when the voltage value of the first digital signal>127, determine that the third scaling factor is a positive number less than 1; and when −61≤the voltage value of the first digital signal≤127, determine that the third scaling factor is 1; and a first calculation unit, configured to:

determine, according to the principle that the product of the third scaling factor and the fourth scaling factor is 1, the fourth scaling factor corresponding to the third scaling factor.

In addition to the foregoing implementation manner, the scaling factor determining unit may further determine the third scaling factor according to the following rules:

when −20≤the voltage value of the first digital signal≤20, it is determined that the third scaling factor is a positive number greater than 1, for example, 2;

when 20≤the voltage value of the first digital signal≤63, or −63≤the voltage value of the first digital signal≤−20, it is determined that the third scaling factor is 1; and when the voltage value of the first digital signal≤−63, or 63≤the voltage value of the first digital signal, it is determined that the third scaling factor is a positive number less than 1, for example, ½, where

[[63 and −63] are a range of a voltage value of a digital signal output after analog-to-digital conversion is performed.

In another implementation manner of this embodiment, the processing module 203 may include:

a first threshold unit, configured to acquire a scaling factor change value corresponding to the voltage value of the first digital signal, and multiply the scaling factor change value by the first scaling factor, to obtain the third scaling factor corresponding to the voltage value of the first digital signal, where when the voltage value of the digital signal is greater than or equal to a preset first upper threshold, or when the voltage value of the digital signal is less than or equal to a preset first lower threshold, the scaling factor change value is K1, where K1 is a positive number and 0<K1<1; when the voltage value of the digital signal is less than or equal to a preset second upper threshold and the voltage value of the digital signal is greater than or equal to a preset second lower threshold, the scaling factor change value is K2, where K2 is a positive number and 1<K2; when the voltage value of the digital signal is greater than the first lower threshold and the voltage value of the digital signal is less than the second lower threshold, the scaling factor change value is equal to 1; and when the voltage value of the digital signal is less than the first upper threshold and the voltage value of the digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127; and a second calculation unit, configured to:

determine, according to the principle that the product of the third scaling factor and the fourth scaling factor is 1, the fourth scaling factor corresponding to the third scaling factor; where the first scaling factor may refer to an initial gain value set by the first gain module 201 in the protection circuit, where the initial gain value may generally be set to 1; or the first scaling factor may be a scaling factor generated according to a voltage value that is sampled before the voltage value of the first digital signal is sampled.

The following describes a working process of the first threshold unit with reference to specific numerical values. It is assumed that an input range of an ADC is −256 to 248 mV, and the number of bits of the ADC is 6. Example 1: The preset first upper threshold is 250, the preset first lower threshold is −250, the preset second upper threshold is 120, and the preset second lower threshold is −120; when the voltage value of the first digital signal is 128, the scaling factor change value is ½; and when the voltage value of the first digital signal is 60, the scaling factor change value is 2. Example 2: The preset first upper threshold is 127, the preset first lower threshold is −125, the preset second upper threshold is 60, and the preset second lower threshold is −61; when the voltage value of the first digital signal is 80, the scaling factor change value is 1; and when the voltage value of the first digital signal is −200, the scaling factor change value is ⅓. Example 3: The preset first upper threshold is 222, the preset first lower threshold is −213, the preset second upper threshold is 30, and the preset second lower threshold is −50; when the voltage value of the first digital signal is 10, the scaling factor change value is 3; and when the voltage value of the first digital signal is 221, the scaling factor change value is 1.

In the case of the foregoing example 1, when the voltage value of the first digital signal is −200, and the voltage value of the second input signal is 300 mV, the scaling factor change value is ⅓, the first scaling factor is 1, and the third scaling factor is ⅓. Therefore, according to the second input signal and the third scaling factor, the second analog signal is calculated to be 100 mV, and in this case, the analog signal is in the input range of the ADC. The foregoing data is merely used as an example, but is not used to limit the ADC.

It should be noted that the thresholds herein are set with reference to a digital signal corresponding to the input range of the ADC. For example, a maximum output value corresponding to the maximum value of the input range of the ADC is used as the first upper threshold, and a half of the foregoing maximum output value is used as the second upper threshold. In this case, when an error signal is not in the input range of the ADC, the gain value is reduced, so as to enable the error signal to fall in the input range of the ADC finally. When the error signal is in the input range of the ADC, but an absolute value is small, the gain value is increased, so that the error signal is large enough, and output precision is improved in a case in which resolution of the ADC is constant. For example, the input range of the ADC is −256 to 248 mV, and the resolution of the ADC is 8 mV. When the voltage value of the error signal output by the ADC is 7 mV, and when a previous analog gain value is 1, an analog signal obtained after the previous analog gain value is added to the error signal is 7 mV, the ADC cannot distinguish the error signal from the analog signal, and the output of the ADC is 0. In this case, the first threshold unit multiplies the previous analog gain value by a gain change value 2, to obtain a current analog gain value 2, amplifies the error signal by using the current analog gain value, to obtain an analog signal of 14 mV, and inputs the analog signal into the ADC. In this case, the ADC can distinguish the input signal, thereby improving output precision.

The scaling factor determining rule further includes: setting a maximum value and a minimum value for the scaling factor.

In a specific implementation process, the foregoing processing module 203 may be an application-specific integrated circuit (Application Specific Integrated Circuit, "ASIC" for short), a field programmable gate array (Field-Programmable Gate Array, "FPGA" for short), and a programmable device, such as a complex programmable logic device (Complex Programmable Logic Device, "CPLD" for short), a discrete hardware circuit, a computer, or a single-chip microcomputer. The foregoing circuit components are merely used as examples, but are not used to limit the present invention. The application-specific integrated circuit herein is an integrated circuit produced for a specific user or a specific electronic system. The discrete hardware circuit is an electronic circuit formed by discrete electronic components on a printed circuit board, where the discrete electronic components include one or more of a resistor, a capacitor, an inductor, a diode, a triode, and a field effect transistor.

Preferably, the foregoing first gain module 201 is an operational amplifier. A maximum value and a minimum value of each of the foregoing first scaling factor and third scaling factor are a maximum value and a minimum value of a factor by which the operational amplifier can perform scaling.

Preferably, the foregoing second gain module 204 is a shift register.

In the embodiment of the present invention, a third scaling factor corresponding to a voltage value of a first digital signal is determined according to the voltage value of the first digital signal converted by an ADC and a preset scaling factor determining rule, a second input signal is scaled according to the third scaling factor, to obtain a second analog signal, and the second analog signal is input into the ADC. Because the third scaling factor is determined according to the first digital signal output by the ADC, after the second input signal is scaled according to the third scaling factor obtained in this manner, and after one or more times of scaling processing, an input signal can be adjusted to be in an input range of the ADC. Therefore, ADC saturation is avoided in the case of start-up, or an input surge current shock, so that even in the case of start-up, or an input surge current shock, the ADC can still work normally, thereby ensuring normal output of a digital power supply, and improving an anti-interference capability and stability of the digital power supply.

Figure 3:
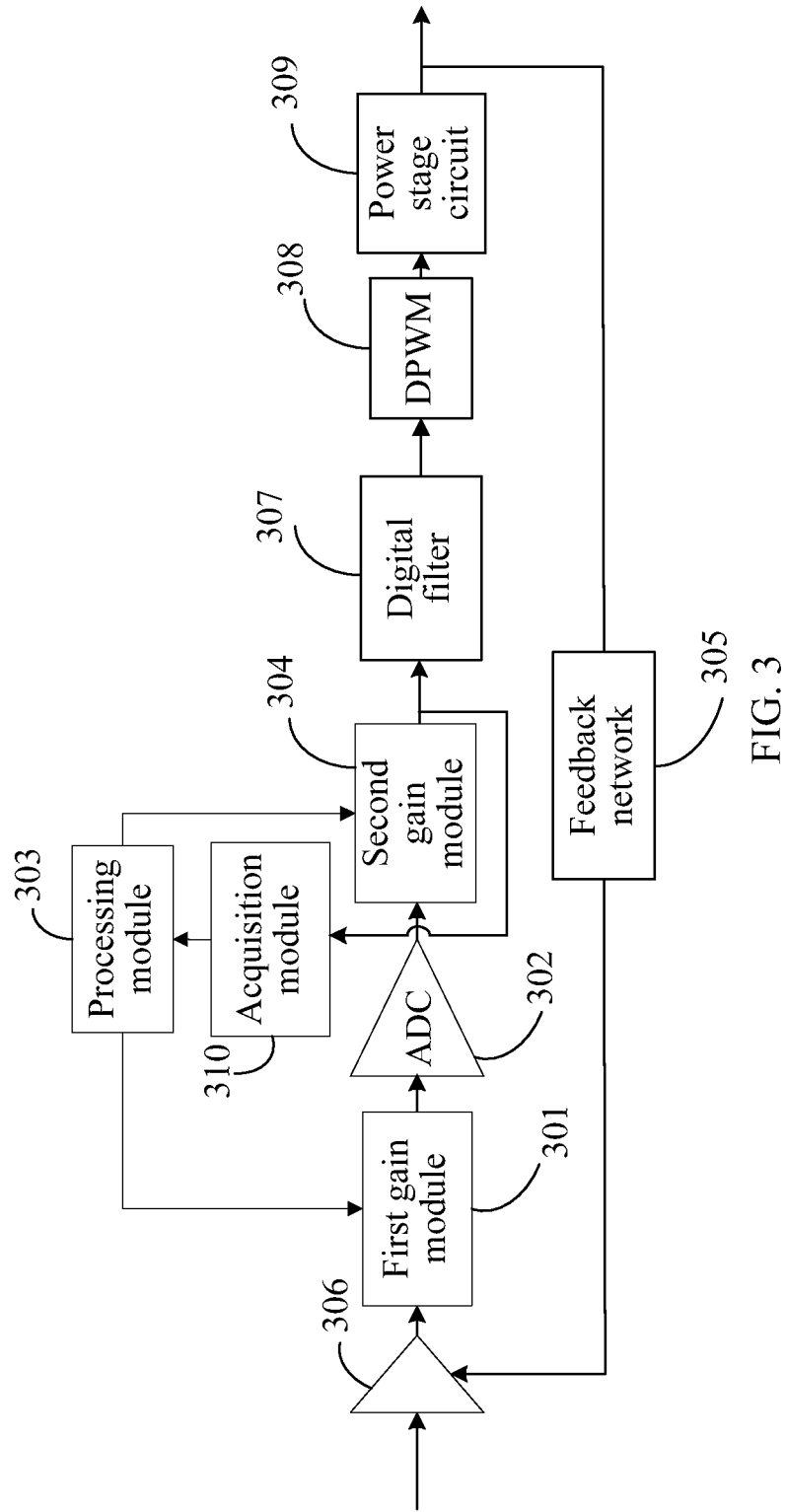
FIG. 3 is a schematic structural diagram of another protection circuit for an analog-to-digital converter according to an embodiment of the present invention.

FIG. 3 is a schematic structural diagram of another protection circuit for an analog-to-digital converter according to an embodiment of the present invention. Referring to FIG. 3, the digital power supply control circuit includes:

a first gain module 301, configured to receive a first input signal, and scale the first input signal according to a first scaling factor, to obtain a first analog signal, where the first gain module 301 is further configured to receive a second input signal, receive a third scaling factor from a processing module 303, and scale the second input signal according to the third scaling factor, to obtain a second analog signal;

an ADC 302, configured to convert the first analog signal obtained by the first gain module 301 into a first digital signal, and configured to convert the second analog signal obtained by the first gain module 301 into a second digital signal;

the processing module 303, configured to determine, according to a voltage value of the first digital signal converted by the ADC 302 and a preset scaling factor determining rule, a third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the ADC 302; and the processing module 303 is further configured to:

determine, according to a principle that a product of the third scaling factor and a fourth scaling factor is 1, the fourth scaling factor corresponding to the third scaling factor; and a second gain module 304, configured to scale the first digital signal according to a second scaling factor, to obtain the scaled first digital signal, and configured to scale the second digital signal according to the fourth scaling factor obtained by the processing module 303, to obtain the scaled second digital signal, where a product of the first scaling factor and the second scaling factor is 1.

The foregoing first input signal and second input signal are error signals generated by comparing output signals of a digital power supply with a reference signal, where the output signals are collected by a feedback network 305, an error amplifier 306 uses the output signals and the reference signal as input, and outputs the error signals.

In a specific implementation of this embodiment, the digital power supply controls output of the digital power supply according to the digital signal output by the ADC 302. A specific process is as follows: A digital filter 307 uses a scaled first digital signal or a scaled second digital signal as input, and sends the output signal to a DPWM 308; and the DPWM 308 generates a pulse width modulation signal according to the output of the digital filter 307, and controls an on-off action of a power stage circuit 309 by using the pulse width modulation signal.

Further, the protection circuit further includes:

an acquisition module 310, configured to sample the scaled first digital signal output by the second gain module 304, to obtain the voltage value of the first digital signal.

In an implementation manner of this embodiment, the processing module 303 may include:

a scaling factor determining unit, configured to receive the voltage value of the first digital signal, and when the voltage value of the first digital signal<−61, determine that the third scaling factor is a positive number less than 1;

when the voltage value of the first digital signal>127, determine that the third scaling factor is a positive number less than 1; and when −61≤the voltage value of the first digital signal≤127, determine that the third scaling factor is 1; and a first calculation unit, configured to:

determine, according to the principle that the product of the third scaling factor and the fourth scaling factor is 1, the fourth scaling factor corresponding to the third scaling factor.

In another implementation manner of this embodiment, the processing module 303 may include:

a first threshold unit, configured to acquire a scaling factor change value corresponding to the voltage value of the first digital signal, and multiply the scaling factor change value by the first scaling factor, to obtain the third scaling factor corresponding to the voltage value of the first digital signal, where when the voltage value of the digital signal is greater than or equal to a preset first upper threshold, or when the voltage value of the digital signal is less than or equal to a preset first lower threshold, the scaling factor change value is K1, where K1 is a positive number and 0<K1<1; when the voltage value of the digital signal is less than or equal to a preset second upper threshold and the voltage value of the digital signal is greater than or equal to a preset second lower threshold, the scaling factor change value is K2, where K2 is a positive number and 1<K2; when the voltage value of the digital signal is greater than the first lower threshold and the voltage value of the digital signal is less than the second lower threshold, the scaling factor change value is equal to 1; and when the voltage value of the digital signal is less than the first upper threshold and the voltage value of the digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127; and a second calculation unit, configured to:

determine, according to the principle that the product of the third scaling factor and the fourth scaling factor is 1, the fourth scaling factor corresponding to the third scaling factor.

In the embodiment of the present invention, a third scaling factor corresponding to a voltage value of a first digital signal is determined according to the voltage value of the first digital signal converted by an ADC and a preset scaling factor determining rule, a second input signal is scaled according to the third scaling factor, to obtain a second analog signal, and the second analog signal is input into the ADC. Because the third scaling factor is determined according to the first digital signal output by the ADC, after the second input signal is scaled according to the third scaling factor obtained in this manner, and after one or more times of scaling processing, an input signal can be adjusted to be in an input range of the ADC. Therefore, ADC saturation is avoided in the case of start-up, or an input surge current shock, so that even in the case of start-up, or an input surge current shock, the ADC can still work normally, thereby ensuring normal output of a digital power supply, and improving an anti-interference capability and stability of the digital power supply.

Figure 4:
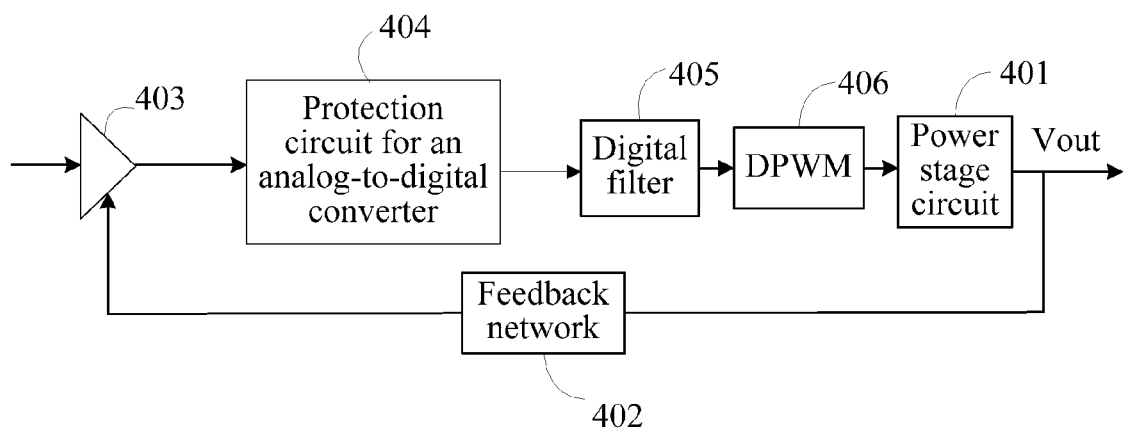
FIG. 4 is a schematic structural diagram of still another digital power supply according to an embodiment of the present invention.

FIG. 4 is a schematic structural diagram of still another digital power supply according to an embodiment of the present invention. Referring to FIG. 4, the digital power supply includes:

a power stage circuit 401;

a feedback network 402, configured to sample an output signal of the power stage circuit 401;

an error amplifier 403, configured to compare a first output signal of the power stage circuit 401 with a reference signal, to obtain a first input signal, where the first output signal is obtained by the feedback network 402 through sampling, and configured to compare a second output signal of the power stage circuit 401 with the reference signal, to obtain a second input signal, where the second output signal is obtained by the feedback network 402 through sampling;

a protection circuit 404 for the analog-to-digital converter according to any one of FIG. 1, FIG. 2, and FIG. 3;

a digital filter 405, configured to generate a second digital control signal according to the scaled second digital signal obtained by the protection circuit for the analog-to-digital converter; and a DPWM 406, configured to convert a duty cycle variation in the second digital control signal output by the digital filter 405 into a pulse width variation, to obtain a pulse width modulation signal, and control an on-off action of a power switch in the power stage circuit 401 by using the pulse width modulation signal.

In the embodiment of the present invention, a third scaling factor corresponding to a voltage value of a first digital signal is determined according to the voltage value of the first digital signal converted by an ADC and a preset scaling factor determining rule, a second input signal is scaled according to the third scaling factor, to obtain a second analog signal, and the second analog signal is input into the ADC. Because the third scaling factor is determined according to the first digital signal output by the ADC, after the second input signal is scaled according to the third scaling factor obtained in this manner, and after one or more times of scaling processing, an input signal can be adjusted to be in an input range of the ADC. Therefore, ADC saturation is avoided in the case of start-up, or an input surge current shock, so that even in the case of start-up, or an input surge current shock, the ADC can still work normally, thereby ensuring normal output of a digital power supply, and improving an anti-interference capability and stability of the digital power supply.

Figure 5:
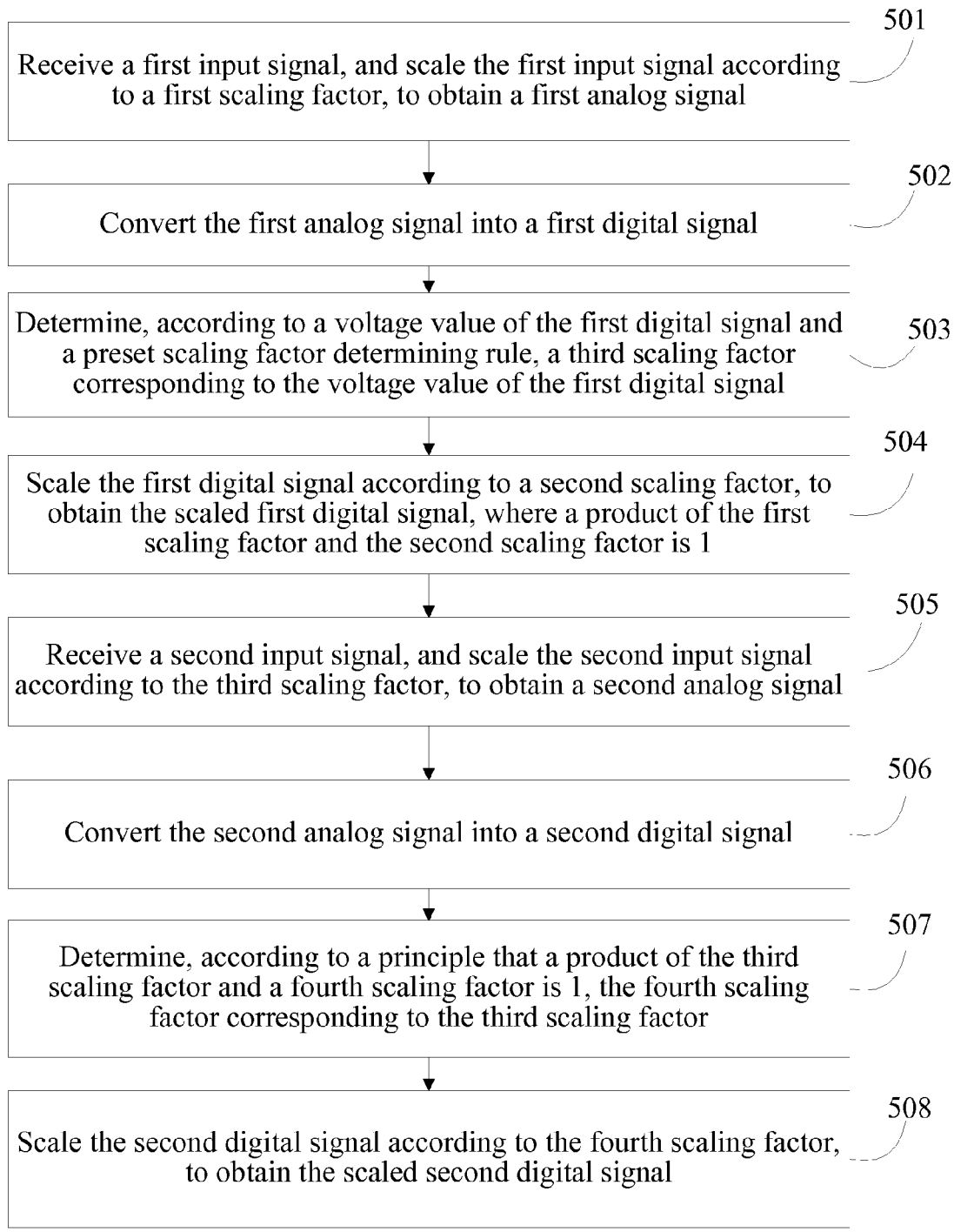
FIG. 5 is a flowchart of a circuit protection method according to an embodiment of the present invention.

FIG. 5 is a flowchart of a circuit protection method according to an embodiment of the present invention. Referring to FIG. 5, a process of the method includes:

Step 501: Receive a first input signal, and scale the first input signal according to a first scaling factor, to obtain a first analog signal.

Step 502: Convert the first analog signal into a first digital signal.

Step 503: Determine, according to a voltage value of the first digital signal and a preset scaling factor determining rule, a third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range may be [−61, 127].

Step 504: Scale the first digital signal according to a second scaling factor, to obtain the scaled first digital signal, where a product of the first scaling factor and the second scaling factor is 1.

Step 505: Receive a second input signal, and scale the second input signal according to the third scaling factor, to obtain a second analog signal.

Step 506: Convert the second analog signal into a second digital signal.

Step 507: Determine, according to a principle that a product of the third scaling factor and a fourth scaling factor is 1, the fourth scaling factor corresponding to the third scaling factor.

Step 508: Scale the second digital signal according to the fourth scaling factor, to obtain the scaled second digital signal.

Further, the foregoing step 503 may include:

Step 1: Sample the first digital signal, to obtain the voltage value of the first digital signal.

Step 2: Receive the voltage value of the first digital signal, and when the voltage value of the first digital signal<−61, determine that the third scaling factor is a positive number less than 1;

when the voltage value of the first digital signal>127, determine that the third scaling factor is a positive number less than 1; and when −61≤the voltage value of the first digital signal≤127, determine that the third scaling factor is 1.

In addition to the foregoing implementation manner, in step 503, the third scaling factor may further be determined according to the following rules:

when −20≤the voltage value of the first digital signal≤20, it is determined that the third scaling factor is a positive number greater than 1, for example, 2;

when 20≤the voltage value of the first digital signal≤63, or −63≤the voltage value of the first digital signal≤−20, it is determined that the third scaling factor is 1; and when the voltage value of the first digital signal≤−63, or 63≤the voltage value of the first digital signal, it is determined that the third scaling factor is a positive number less than 1, for example, ½.

In another implementation manner of this embodiment, step 503 may further be implemented in the following manner:

acquiring a scaling factor change value corresponding to the voltage value of the first digital signal, and multiplying the scaling factor change value by the first scaling factor, to obtain the third scaling factor corresponding to the voltage value of the first digital signal, where when the voltage value of the digital signal is greater than or equal to a preset first upper threshold, or when the voltage value of the digital signal is less than or equal to a preset first lower threshold, the scaling factor change value is K1, where K1 is a positive number and 0<K1<1; when the voltage value of the digital signal is less than or equal to a preset second upper threshold and the voltage value of the digital signal is greater than or equal to a preset second lower threshold, the scaling factor change value is K2, where K2 is a positive number and 1<K2; when the voltage value of the digital signal is greater than the first lower threshold and the voltage value of the digital signal is less than the second lower threshold, the scaling factor change value is equal to 1; and when the voltage value of the digital signal is less than the first upper threshold and the voltage value of the digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127, where the first scaling factor may be an initial gain value, where the initial gain value may generally be set to 1.

The following describes the foregoing implementation manner by using an example: Example 1: The preset first upper threshold is 250, the preset first lower threshold is −250, the preset second upper threshold is 120, and the preset second lower threshold is −120; when the voltage value of the first digital signal is 128, the scaling factor change value is ½; and when the voltage value of the first digital signal is 60, the scaling factor change value is 2. Example 2: The preset first upper threshold is 127, the preset first lower threshold is −125, the preset second upper threshold is 60, and the preset second lower threshold is −61; when the voltage value of the first digital signal is 80, the scaling factor change value is 1; and when the voltage value of the first digital signal is −200, the scaling factor change value is ⅓. Example 3: The preset first upper threshold is 222, the preset first lower threshold is −213, the preset second upper threshold is 30, and the preset second lower threshold is −50; when the voltage value of the first digital signal is 10, the scaling factor change value is 3; and when the voltage value of the first digital signal is 221, the scaling factor change value is 1.

In the case of the foregoing example 1, when the voltage value of the first digital signal is −200, and the second input signal is 300 mV, the scaling factor change value is ⅓, the first scaling factor is 1, and the third scaling factor is ⅓. Therefore, according to the second input signal and the third scaling factor, the second analog signal is calculated to be 100 mV, and in this case, the analog signal is in the input range of the ADC. The foregoing data is merely used as an example, but is not used to limit the ADC.

In the embodiment of the present invention, a third scaling factor corresponding to a voltage value of a first digital signal is determined according to the voltage value of the first digital signal converted by an ADC and a preset scaling factor determining rule, a second input signal is scaled according to the third scaling factor, to obtain a second analog signal, and the second analog signal is input into the ADC. Because the third scaling factor is determined according to the first digital signal output by the ADC, after the second input signal is scaled according to the third scaling factor obtained in this manner, and after one or more times of scaling processing, an input signal can be adjusted to be in an input range of the ADC. Therefore, ADC saturation is avoided in the case of start-up, or an input surge current shock, so that even in the case of start-up, or an input surge current shock, the ADC can still work normally, thereby ensuring normal output of a digital power supply, and improving an anti-interference capability and stability of the digital power supply.

Figure 6:
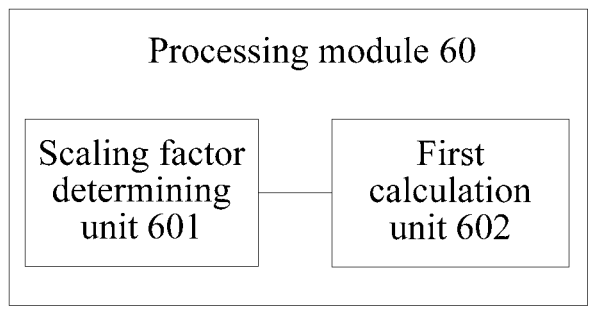
FIG. 6 is a schematic structural diagram of a processor according to an embodiment of the present invention.

FIG. 6 is a schematic structural diagram of a processor according to an embodiment of the present invention. Referring to FIG. 6, as a processing module 60 in the protection circuit for the analog-to-digital converter in any one of FIG. 1, FIG. 2, and FIG. 3, the processor includes:

a scaling factor determining unit 601, configured to receive a voltage value of a first digital signal, and configured to determine, according to the voltage value of the first digital signal and a preset scaling factor determining rule, a third scaling factor corresponding to the voltage value of the first digital signal, where the scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the analog-to-digital converter; and a first calculation unit 602, configured to:

determine, according to a principle that a product of the third scaling factor and a fourth scaling factor is 1, the fourth scaling factor corresponding to the third scaling factor.

In an embodiment of the present invention, the scaling factor determining unit 601 includes:

a receiving subunit, configured to receive the voltage value of the first digital signal;

a determining subunit, configured to:

when the voltage value of the first digital signal<−61, determine that the third scaling factor is a positive number less than 1;

when the voltage value of the first digital signal>127, determine that the third scaling factor is a positive number less than 1; and when −61≤the voltage value of the first digital signal≤127, determine that the third scaling factor is 1; and a first calculation unit 602, configured to:

determine, according to the principle that the product of the third scaling factor and the fourth scaling factor is 1, the fourth scaling factor corresponding to the third scaling factor.

In addition to the foregoing implementation manner, the scaling factor determining unit 602 may further determine the third scaling factor according to the following rules:

when −20≤the voltage value of the first digital signal≤20, it is determined that the third scaling factor is a positive number greater than 1, for example, 2;

when 20≤the voltage value of the first digital signal≤63, or −63≤the voltage value of the first digital signal≤−20, it is determined that the third scaling factor is 1; and when the voltage value of the first digital signal≤−63, or 63≤the voltage value of the first digital signal, it is determined that the third scaling factor is a positive number less than 1, for example, ½, where

[63 and −63] are a range of a voltage value of a digital signal output after analog-to-digital conversion is performed.

In another implementation manner of this embodiment, the scaling factor determining unit 601 may further include:

a first threshold subunit, configured to acquire a scaling factor change value corresponding to the voltage value of the first digital signal, where when the voltage value of the digital signal is greater than or equal to a preset first upper threshold, or when the voltage value of the digital signal is less than or equal to a preset first lower threshold, the scaling factor change value is K1, where K1 is a positive number and 0<K1<1; when the voltage value of the digital signal is less than or equal to a preset second upper threshold and the voltage value of the digital signal is greater than or equal to a preset second lower threshold, the scaling factor change value is K2, where K2 is a positive number and 1<K2; when the voltage value of the digital signal is greater than the first lower threshold and the voltage value of the digital signal is less than the second lower threshold, the scaling factor change value is equal to 1; and when the voltage value of the digital signal is less than the first upper threshold and the voltage value of the digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127; and a second threshold subunit, configured to:

multiply the scaling factor change value by the first scaling factor, to obtain the third scaling factor corresponding to the voltage value of the first digital signal, where the first scaling factor may be an initial gain value set by a first gain module 201 in the protection circuit, where the initial gain value may generally be set to 1.

The following describes a working process of the first threshold unit with reference to specific numerical values. It is assumed that an input range of an ADC is −256 to 248 mV, and the number of bits of the ADC is 6. Example 1: The preset first upper threshold is 250, the preset first lower threshold is −250, the preset second upper threshold is 120, and the preset second lower threshold is −120; when the voltage value of the first digital signal is 128, the scaling factor change value is ½; and when the voltage value of the first digital signal is 60, the scaling factor change value is 2. Example 2: The preset first upper threshold is 127, the preset first lower threshold is −125, the preset second upper threshold is 60, and the preset second lower threshold is −61; when the voltage value of the first digital signal is 80, the scaling factor change value is 1; and when the voltage value of the first digital signal is −200, the scaling factor change value is ⅓. Example 3: The preset first upper threshold is 222, the preset first lower threshold is −213, the preset second upper threshold is 30, and the preset second lower threshold is −50; when the voltage value of the first digital signal is 10, the scaling factor change value is 3; and when the voltage value of the first digital signal is 221, the scaling factor change value is 1.

In the case of the foregoing example 1, when the voltage value of the first digital signal is −200, and the second input signal is 300 mV, the scaling factor change value is ⅓, the first scaling factor is 1, and the third scaling factor is ⅓. Therefore, according to the second input signal and the third scaling factor, the second analog signal is calculated to be 100 mV, and in this case, the analog signal is in the input range of the ADC. The foregoing data is merely used as an example, but is not used to limit the ADC.

It should be noted that the thresholds herein are set with reference to a digital signal corresponding to the input range of the ADC. For example, a maximum output value corresponding to the maximum value of the input range of the ADC is used as the first upper threshold, and a half of the foregoing maximum output value is used as the second upper threshold. In this case, when an error signal is not in the input range of the ADC, the gain value is reduced, so as to enable the error signal to fall in the input range of the ADC finally. When the error signal is in the input range of the ADC, but an absolute value is small, the gain value is increased, so that the error signal is large enough, and output precision is improved in a case in which resolution of the ADC is constant. For example, the input range of the ADC is −256 to 248 mV, and the resolution of the ADC is 8 mV. When the error signal output by the ADC is 7 mV, and when a previous analog gain value is 1, an analog signal obtained after the previous analog gain value is added to the error signal is 7 mV, the ADC cannot distinguish the error signal from the analog signal, and the output of the ADC is 0. In this case, the first threshold unit multiplies the previous analog gain value by a gain change value 2, to obtain a current analog gain value 2, amplifies the error signal by using the current analog gain value, to obtain an analog signal of 14 mV, and inputs the analog signal into the ADC. In this case, the ADC can distinguish the input signal, thereby improving output precision.

The scaling factor determining rule further includes: setting a maximum value and a minimum value for the scaling factor.

Figure 7:
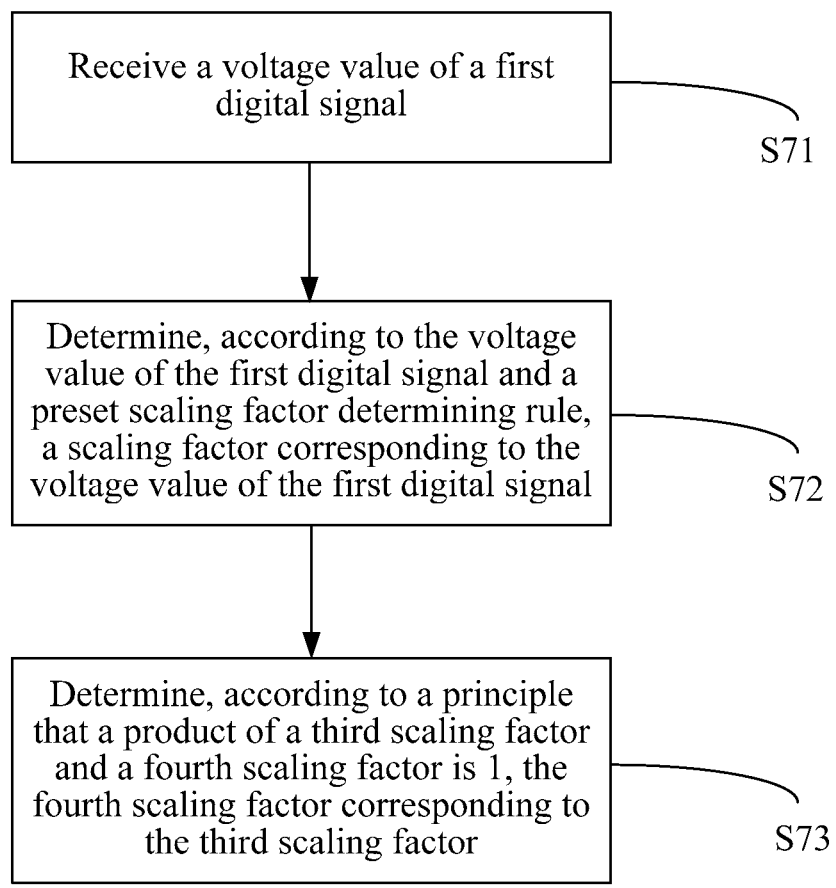
FIG. 7 is a flowchart of a digital signal processing method according to an embodiment of the present invention.

FIG. 7 is a flowchart of a digital signal processing method according to an embodiment of the present invention. As shown in FIG. 7, the digital signal processing method includes:

S71: Receive a voltage value of a first digital signal.

S72: Determine, according to the voltage value of the first digital signal and a preset scaling factor determining rule, a scaling factor corresponding to the voltage value of the first digital signal.

The scaling factor determining rule includes that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1, where the preset range is a range of a voltage value of a digital signal obtained after analog-to-digital conversion is performed on an analog signal in a normal input range of the analog-to-digital converter.

In an embodiment of the present invention, the preset range is [−61, 127].

In an embodiment of the present invention, the determining, according to the voltage value of the first digital signal and a preset scaling factor determining rule, a scaling factor corresponding to the voltage value of the first digital signal includes:

when the voltage value of the first digital signal<−61, determining that the third scaling factor is a positive number less than 1;

when the voltage value of the first digital signal>127, determining that the third scaling factor is a positive number less than 1; and when −61≤the voltage value of the first digital signal≤127, determining that the third scaling factor is 1.

S73: Determine, according to a principle that a product of the third scaling factor and a fourth scaling factor is 1, the fourth scaling factor corresponding to the third scaling factor.

In an embodiment of the present invention, the determining, according to the voltage value of the first digital signal and a preset scaling factor determining rule, a third scaling factor corresponding to the voltage value of the first digital signal includes:

multiplying a scaling factor change value by the first scaling factor, to obtain the third scaling factor corresponding to the voltage value of the first digital signal, where when the voltage value of the first digital signal is greater than or equal to a preset first upper threshold, or when the voltage value of the first digital signal is less than or equal to a preset first lower threshold, the scaling factor change value is K1, where K1 is a positive number and 0<K1<1; when the voltage value of the first digital signal is less than or equal to a preset second upper threshold and the voltage value of the first digital signal is greater than or equal to a preset second lower threshold, the scaling factor change value is K2, where K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, where the first lower threshold<the second lower threshold<0<the second upper threshold<the first upper threshold, −256≤the first lower threshold≤−125, 127≤the first upper threshold≤256, −125≤the second lower threshold≤−61, and −61<the second upper threshold<127.

It may be understood that for the method process provided in the embodiment of the present invention, reference may be made to the preceding process of implementing the function by the processing module.

In a specific implementation process, the foregoing processing module may be a programmable device, such as an ASIC, an FPGA, or a CPLD, a discrete hardware circuit, a computer, or a single-chip microcomputer. The foregoing circuit components are merely used as examples, but are not used to limit the present invention. The application-specific integrated circuit herein is an integrated circuit produced for a specific user or a specific electronic system. The discrete hardware circuit is an electronic circuit formed by discrete electronic components on a printed circuit board, where the discrete electronic components include one or more of a resistor, a capacitor, an inductor, a diode, a triode, and a field effect transistor.

It should be noted that when the protection circuit for the analog-to-digital converter provided in the foregoing embodiment works, division of the foregoing function modules is merely exemplary; and in an actual application, the foregoing functions can be allocated to different function modules for implementation as necessary, that is, an internal structure of the protection circuit for the analog-to-digital converter is divided into different function modules to implement all or a part of the functions described above. In addition, the protection circuit for the analog-to-digital converter provided in the foregoing embodiment and the embodiment of the circuit protection method belong to a same idea. For a specific implementation process, refer to the method embodiments, which is not described herein again.

A person of ordinary skill in the art may understand that all or a part of the steps of the embodiments may be implemented by hardware or a program instructing relevant hardware. The program may be stored in a computer readable storage medium. The storage medium may include: a read-only memory, a magnetic disk, or an optical disc.

What is claimed is:

1. A protection circuit for an analog-to-digital converter, wherein the protection circuit comprises:
a first gain module, configured to receive a first input signal, and scale the first input signal according to a first scaling factor, to obtain a first analog signal, wherein the first gain module is further configured to receive a second input signal, receive a third scaling factor from a processing module, and scale the second input signal according to the third scaling factor, to obtain a second analog signal;
an analog-to-digital converter, configured to convert the first analog signal obtained by the first gain module into a first digital signal, and configured to convert the second analog signal obtained by the first gain module into a second digital signal;
the processing module, configured to determine, according to a voltage value of the first digital signal converted by the analog-to-digital converter and a preset scaling factor determining rule, the third scaling factor corresponding to the voltage value of the first digital signal, wherein the scaling factor determining rule comprises that:
if the voltage value of the first digital signal is in a preset range, the scaling factor is equal to 1;
if the voltage value of the first digital signal is greater than a maximum value of the preset range, the scaling factor is a positive number less than 1; and
if the voltage value of the first digital signal is less than a minimum value of the preset range, the scaling factor is a positive number less than 1, wherein
the preset range is a range of a voltage value of a digital signal obtained after analog-to-digital conversion is performed on an analog signal in a normal input range of the analog-to-digital converter; and
the processing module is further configured to:
determine, according to a principle that a product of the third scaling factor and a fourth scaling factor is 1, the fourth scaling factor corresponding to the third scaling factor; and
a second gain module, configured to scale the first digital signal according to a second scaling factor, to obtain the scaled first digital signal, and
configured to scale the second digital signal according to the fourth scaling factor obtained by the processing module, to obtain the scaled second digital signal, wherein a product of the first scaling factor and the second scaling factor is 1.

2. The protection circuit for the analog-to-digital converter according to claim 1, wherein the protection circuit further comprises:
an acquisition module, configured to sample the first digital signal converted by the analog-to-digital converter, to obtain the voltage value of the first digital signal.

3. The protection circuit for the analog-to-digital converter according to claim 1, wherein the processing module comprises:
a scaling factor determining unit, configured to receive the voltage value of the first digital signal, and
when the voltage value of the first digital signal<−61, determine that the third scaling factor is a positive number less than 1;
when the voltage value of the first digital signal>127, determine that the third scaling factor is a positive number less than 1; and
when −61≤the voltage value of the first digital signal≤127, determine that the third scaling factor is 1; and
a first calculation unit, configured to:
determine, according to the principle that the product of the third scaling factor and the fourth scaling factor is 1, the fourth scaling factor corresponding to the third scaling factor.

4. The protection circuit for the analog-to-digital converter according to claim 1, wherein
the processing module comprises: a first threshold unit, configured to acquire a scaling factor change value corresponding to the voltage value of the first digital signal, and multiply the scaling factor change value by the first scaling factor, to obtain the third scaling factor corresponding to the voltage value of the first digital signal, wherein
when the voltage value of the first digital signal is greater than or equal to a preset first upper threshold, or when the voltage value of the first digital signal is less than or equal to a preset first lower threshold, the scaling factor change value is K1, wherein K1 is a positive number and 0<K1<1; when the voltage value of the first digital signal is less than or equal to a preset second upper threshold and the voltage value of the first digital signal is greater than or equal to a preset second lower threshold, the scaling factor change value is K2, wherein K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, wherein the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127; and a second calculation unit, configured to:

determine, according to the principle that the product of the third scaling factor and the fourth scaling factor is 1, the fourth scaling factor corresponding to the third scaling factor.

5. The protection circuit for the analog-to-digital converter according to claim 1, wherein the first gain module comprises an operational amplifier.

6. The protection circuit for the analog-to-digital converter according to claim 1, wherein the second gain module comprises a shift register.

7. A digital power supply, wherein the digital power supply comprises:

a power stage circuit;

a feedback network, configured to sample an output signal of the power stage circuit;

an error amplifier, configured to compare a first output signal of the power stage circuit with a reference signal, to obtain a first input signal, wherein the first output signal is obtained by the feedback network through sampling, and configured to compare a second output signal of the power stage circuit with the reference signal, to obtain a second input signal, wherein the second output signal is obtained by the feedback network through sampling;

the protection circuit for the analog-to-digital converter according to claim 1;

a digital filter, configured to generate a second digital control signal according to scaled second digital signal obtained by the protection circuit for the analog-to-digital converter; and a digital pulse width modulator, configured to convert a duty cycle variation in the second digital control signal output by the digital filter into a pulse width variation, to obtain a pulse width modulation signal, and control an on-off action of a power switch in the power stage circuit by using the pulse width modulation signal.

8. A circuit protection method, wherein the protection method comprises:

receiving a first input signal, and scaling the first input signal according to a first scaling factor, to obtain a first analog signal;

converting, by an analog-to-digital converter, the first analog signal into a first digital signal;

determining, according to a voltage value of the first digital signal and a preset scaling factor determining rule, a third scaling factor corresponding to the voltage value of the first digital signal, wherein the scaling factor determining rule comprises that:

if the voltage value of the first digital signal is in a preset range, the scaling factor is equal to 1;

if the voltage value of the first digital signal is greater than a maximum value of the preset range, the scaling factor is a positive number less than 1; and if the voltage value of the first digital signal is less than a minimum value of the preset range, the scaling factor is a positive number less than 1;

scaling the first digital signal according to a second scaling factor, to obtain the scaled first digital signal, wherein a product of the first scaling factor and the second scaling factor is 1;

receiving a second input signal, and scaling the second input signal according to the third scaling factor, to obtain a second analog signal;

converting, by the analog-to-digital converter, the second analog signal into a second digital signal;

determining, according to a principle that a product of the third scaling factor and a fourth scaling factor is 1, the fourth scaling factor corresponding to the third scaling factor; and scaling the second digital signal according to the fourth scaling factor, to obtain the scaled second digital signal.

9. The circuit protection method according to claim 8, wherein the preset range is [−61, 127].

10. The circuit protection method according to claim 8, wherein the determining, according to a voltage value of the first digital signal and a preset scaling factor determining rule, a third scaling factor corresponding to the voltage value of the first digital signal comprises:

multiplying a scaling factor change value by the first scaling factor, to obtain the third scaling factor corresponding to the voltage value of the first digital signal, wherein when the voltage value of the first digital signal is greater than or equal to a preset first upper threshold, or when the voltage value of the first digital signal is less than or equal to a preset first lower threshold, the scaling factor change value is K1, wherein K1 is a positive number and 0<K1<1; when the voltage value of the first digital signal is less than or equal to a preset second upper threshold and the voltage value of the first digital signal is greater than or equal to a preset second lower threshold, the scaling factor change value is K2, wherein K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, wherein the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127.

11. A processing module in a protection circuit for an analog-to-digital converter, wherein the processing module comprises:

a scaling factor determining unit, configured to receive a voltage value of a first digital signal, and configured to determine, according to the voltage value of the first digital signal and a preset scaling factor determining rule, a third scaling factor corresponding to the voltage value of the first digital signal, wherein the scaling factor determining rule comprises that:
if the voltage value of the first digital signal is in a preset range, the scaling factor is equal to 1;
if the voltage value of the first digital signal is greater than a maximum value of the preset range, the scaling factor is a positive number less than 1; and
if the voltage value of the first digital signal is less than a minimum value of the preset range, the scaling factor is a positive number less than 1, wherein
the preset range is a range of a voltage value of a digital signal obtained after analog-to-digital conversion is performed on an analog signal in a normal input range of the analog-to-digital converter; and
a first calculation unit, configured to:
determine, according to a principle that a product of the third scaling factor and a fourth scaling factor is 1, the fourth scaling factor corresponding to the third scaling factor.

12. The processing module according to claim 11, wherein the preset range is [−61, 127].

13. The processing module according to claim 11, wherein the scaling factor determining unit comprises:
a receiving subunit, configured to receive the voltage value of the first digital signal; and
a determining subunit, configured to: when the voltage value of the first digital signal<−61, determine that the third scaling factor is a positive number less than 1;
when the voltage value of the first digital signal>127, determine that the third scaling factor is a positive number less than 1; and
when −61≤the voltage value of the first digital signal≤127, determine that the third scaling factor is 1.

14. The processing module according to claim 11, wherein the scaling factor determining unit comprises: a first threshold subunit, configured to acquire a scaling factor change value corresponding to the voltage value of the first digital signal,
wherein
when the voltage value of the first digital signal is greater than or equal to a preset first upper threshold, or when the voltage value of the first digital signal is less than or equal to a preset first lower threshold, the scaling factor change value is K1, wherein K1 is a positive number and 0<K1<1; when the voltage value of the first digital signal is less than or equal to a preset second upper threshold and the voltage value of the first digital signal is greater than or equal to a preset second lower threshold, the scaling factor change value is K2, wherein K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, wherein the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127; and
a second threshold subunit, configured to multiply the scaling factor change value by the first scaling factor, to obtain the third scaling factor corresponding to the voltage value of the first digital signal.

15. A digital signal processing method, wherein the method comprises:
receiving a voltage value of a first digital signal;
determining, according to the voltage value of the first digital signal and a preset scaling factor determining rule, a third scaling factor corresponding to the voltage value of the first digital signal, wherein the third scaling factor determining rule comprises that:
if the voltage value of the first digital signal is in a preset range, the scaling factor is equal to 1;
if the voltage value of the first digital signal is greater than a maximum value of the preset range, the scaling factor is a positive number less than 1; and
if the voltage value of the first digital signal is less than a minimum value of the preset range, the scaling factor is a positive number less than 1, wherein
the preset range is a range of a voltage value of a digital signal obtained after analog-to-digital conversion is performed on an analog signal in a normal input range of the analog-to-digital converter; and
determining, according to a principle that a product of the third scaling factor and a fourth scaling factor is 1, the fourth scaling factor corresponding to the third scaling factor.

16. The digital signal processing method according to claim 15, wherein the determining, according to the voltage value of the first digital signal and a preset scaling factor determining rule, a third scaling factor corresponding to the voltage value of the first digital signal comprises:
multiplying a scaling factor change value by the first scaling factor, to obtain the third scaling factor corresponding to the voltage value of the first digital signal, wherein
when the voltage value of the first digital signal is greater than or equal to a preset first upper threshold, or when the voltage value of the first digital signal is less than or equal to a preset first lower threshold, the scaling factor change value is K1, wherein K1 is a positive number and 0<K1<1; when the voltage value of the first digital signal is less than or equal to a preset second upper threshold and the voltage value of the first digital signal is greater than or equal to a preset second lower threshold, the scaling factor change value is K2, wherein K2 is a positive number and 1<K2; when the voltage value of the first digital signal is greater than the first lower threshold and the voltage value of the first digital signal is less than the second lower threshold, the scaling factor change value is equal to 1; and when the voltage value of the first digital signal is less than the first upper threshold and the voltage value of the first digital signal is greater than the second upper threshold, the scaling factor change value is equal to 1, wherein the first lower threshold<the second lower threshold<0<the second upper threshold<the first upper threshold, −256≤the first lower threshold≤−125, 127≤the first upper threshold≤256, −125<the second lower threshold≤−61, and −61<the second upper threshold<127.

17. The digital signal processing method according to claim 15, wherein the preset range is [−61, 127].

18. The digital signal processing method according to claim 15, wherein the determining, according to the voltage value of the first digital signal and a preset scaling factor determining rule, the third scaling factor corresponding to the voltage value of the first digital signal comprises:
when the voltage value of the first digital signal<−61, determining that the third scaling factor is a positive number less than 1;

when the voltage value of the first digital signal>127, determining that the third scaling factor is a positive number less than 1; and when $-61 \leq$ the voltage value of the first digital signal$\leq 127$, determining that the third scaling factor is 1.

* * * * *